United States Patent
Alasaarela et al.

(10) Patent No.: US 9,708,710 B2
(45) Date of Patent: Jul. 18, 2017

(54) ATOMIC LAYER DEPOSITION METHOD FOR COATING A SUBSTRATE SURFACE USING SUCCESSIVE SURFACE REACTIONS WITH MULTIPLE PRECURSORS

(71) Applicant: BENEQ OY, Espoo (FI)

(72) Inventors: Tapani Alasaarela, Helsinki (FI); Pekka Soininen, Helsinki (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 14/900,816

(22) PCT Filed: Jun. 26, 2014

(86) PCT No.: PCT/FI2014/050527
§ 371 (c)(1),
(2) Date: Dec. 22, 2015

(87) PCT Pub. No.: WO2014/207316
PCT Pub. Date: Dec. 31, 2014

(65) Prior Publication Data
US 2016/0168703 A1    Jun. 16, 2016

(30) Foreign Application Priority Data
Jun. 27, 2013    (FI) .................................... 20135707

(51) Int. Cl.
*C23C 16/455* (2006.01)
*C23C 16/04* (2006.01)
*C23C 16/54* (2006.01)

(52) U.S. Cl.
CPC ........ *C23C 16/45563* (2013.01); *C23C 16/04* (2013.01); *C23C 16/45551* (2013.01); *C23C 16/545* (2013.01)

(58) Field of Classification Search
CPC ........ C23C 16/45525; C23C 16/45551; C23C 16/45563
See application file for complete search history.

(56) References Cited

U.S. PATENT DOCUMENTS

| 2002/0100424 | A1 | 8/2002 | Sun et al. |
| 2009/0081826 | A1 * | 3/2009 | Cowdery-Corvan . C23C 16/407 438/104 |

(Continued)

FOREIGN PATENT DOCUMENTS

| EP | 2159304 A1 * | 8/2008 |
| EP | 2159304 A1 | 3/2010 |

(Continued)

OTHER PUBLICATIONS

George, S.M. et al., "Atomic Layer Deposition for Continuous Roll-to-Roll Processing". 2011 Society of Vacuum Coaters: 54th Annual Technical Conference Proceedings, Chicago, IL Apr. 16-21, 2011, pp. 76-81.*

(Continued)

*Primary Examiner* — Bret Chen
(74) *Attorney, Agent, or Firm* — Eversheds Sutherland (US) LLP

(57) ABSTRACT

Methods for providing one or more coating layers on a surface of a substrate by successive surface reactions of at least a first and second precursor are provided. The methods generally include supplying the first precursor from a first precursor nozzle and the second precursor from a second precursor nozzle to the surface of the substrate, and moving the substrate relative to at least one of the first and second precursor nozzle. The methods can further include subjecting only one or more first limited sub-areas of the surface of the substrate to the first and second precursor by cooperation of supplying the first and second precursor and simultane- (Continued)

ously moving the substrate relative to at least one of the first and second precursor nozzle.

10 Claims, 14 Drawing Sheets

(56) References Cited

U.S. PATENT DOCUMENTS

| | | | |
|---|---|---|---|
| 2011/0121283 A1* | 5/2011 | Levy | C23C 16/04 257/43 |
| 2012/0207926 A1 | 8/2012 | Lee | |
| 2013/0143415 A1* | 6/2013 | Yudovsky | C23C 16/45551 438/765 |
| 2014/0061795 A1* | 3/2014 | Levy | H01L 29/42384 257/347 |
| 2015/0031157 A1* | 1/2015 | Elam | C23C 16/45551 438/46 |

FOREIGN PATENT DOCUMENTS

| | | |
|---|---|---|
| EP | 2557198 A1 | 2/2013 |
| WO | 2009032960 A1 | 3/2009 |

OTHER PUBLICATIONS

Levy, David H., et al., "Spatial Atomic Layer Deposition: A Path to High-Quality Films on Continuous Substrates". Eastman Kodak Company, pp. 1-3. No date or citation available.*
Poodt, Paul, et al., "Spatial atomic layer deposition: A route towards further industrialization of atomic layer deposition". J. Vac. Sci. Technol. A 30(1), Jan./Feb. 2012, 010802-1 to 010802-11.*
International Search Report for PCT/FI2014/050527 dated Oct. 24, 2014.
Preliminary Report on Patentability issued in PCT/FI2014/050527 dated Nov. 10, 2015.
Finnish Search Report issued in Finnish Application No. 20135707 dated Apr. 17, 2014.

* cited by examiner

ATOMIC LAYER DEPOSITION METHOD FOR COATING A SUBSTRATE SURFACE USING SUCCESSIVE SURFACE REACTIONS WITH MULTIPLE PRECURSORS

CROSS REFERENCE TO RELATED APPLICATIONS

The present application is a national stage of PCT/FI2014/050527, filed on Jun. 26, 2014 and published as WO 2014/207316, which claims priority to Finish Patent Application No. 20135707, filed on Jun. 27, 2013. The disclosures of the aforementioned applications are incorporated herein in their entirety.

FIELD OF THE INVENTION

The present invention relates to method for providing one or more coating layers on a surface of a substrate by successive surface reactions of at least a first precursor and a second precursor according to the principles of atomic layer deposition, and particularly to method according to the preamble of claim 1. The present invention further relates to an apparatus for providing one or more layers on a surface of a substrate by successive surface reactions of at least a first precursor and a second precursor according to the principles of atomic layer deposition.

BACKGROUND OF THE INVENTION

Atomic layer deposition (ALD) is used for providing coating layers on substrates for manufacturing products, such as semiconductors, electrical components, optical components or photovoltaic cells. According to the basic characteristics of ALD the coating layers grow on all surfaces of the substrate and cover each surface fully. However, when manufacturing such products it is not always desirable to provide coating layers which cover one surface entirely. For example electrical connections may be provided to the substrates and it is not desirable to form coating layers on the electrical connections. Therefore it is desirable to manufacture substrates for products production in which coating ALD coating layers are formed only on limited sub-areas of a surface of the substrate.

In prior art substrates having only limited sub-areas of a substrate coated with ALD coating layers are formed by two different manners: preventing coating formation of coating layers on the surface of a substrate using masks covering a portion of the surface of the substrate, or removing coating layers from a portion of the surface of the substrate after the coating process. Masks or the like are placed on the surface of the substrate to prevent material growth on the area of the surface of the substrate which the mask covers during the coating process. Produced coating layers are usually removed from the surface of the substrate by etching or the like removal process after the coating layers are produced on the surface of the substrate.

The prior art methods for producing substrates having ALD coating layers only on limited sub-areas of a surface of the substrate require additional process steps to be performed before the actual coating process or after the actual coating process as mentioned above relating to the use of masks and removal of portions of the produced coating layers. These additional process steps lower the production efficiency as they are time consuming and make the production process more complicated. Furthermore, masking does not efficiently prevent coating layers from growing on the masked areas as the precursor gases tend to penetrate from the edge regions of the mask between the mask and the surface of the substrate.

BRIEF DESCRIPTION OF THE INVENTION

An object of the present invention is to provide a method and an apparatus so as to overcome or at least alleviate the above mentioned disadvantages. The objects of the invention are achieved by a method which is characterized by what is stated in the characterizing portion of the claim 1. The objects of the present invention are further achieved by an apparatus which is characterized by what is stated in the characterizing portion of the claim 11.

The preferred embodiments of the invention are disclosed in the dependent claims.

The present invention provides a method and apparatus for providing one or more coating layers on a surface of a substrate by successive surface reactions of at least a first precursor and a second precursor according to the principles of atomic layer deposition. The of the present invention is based on the idea of providing one or more coating layers on a surface of a substrate by successive surface reactions of at least a first pre-cursor and a second precursor according to the principles of atomic layer deposition. The method comprises: supplying the first precursor from at least one first precursor nozzle and the second precursor from at least one second precursor nozzle to the surface of the substrate; and simultaneously moving the substrate relative to at least one of the first precursor nozzle and second precursor nozzle for subjecting the surface of the substrate to successive surface reactions of the at least the first precursor and the second precursor. The method further comprises subjecting one or more first limited sub-areas of the surface of the substrate to both the first precursor and the second precursor and one or more second sub-areas of the surface of the substrate to only one precursor or to no precursors, first precursor or second precursor or neither of the first and second precursor by co-operation of supplying the first precursor and the second precursor and simultaneously moving the substrate relative to at least one of the first precursor nozzle and second precursor nozzle for providing one or more coating layers on the first limited sub-areas of the surface of the substrate. The method may also comprise supplying the first precursor from at least one first precursor nozzle and the second precursor from at least one second precursor nozzle the surface of the substrate and simultaneously moving the substrate relative to at least one of the first precursor nozzle and second precursor nozzle for subjecting the surface of the substrate to successive surface reactions of the at least the first precursor and the second precursor. The first and second precursor nozzle may be moved synchronized together or they may be immobile relative to each other, or alternative they may be moved relative to each other and relative to the substrate. According to the present invention the method further comprises subjecting only one or more first limited sub-areas of the surface of the substrate to both the first precursor and the second precursor and one or more second sub-areas of the surface of the substrate to first precursor or second precursor or neither of the first and second precursor by adjusting the supply of the first precursor and the second precursor and the simultaneous movement of the substrate relative to at least one of the first precursor nozzle and second precursor nozzle for providing one or more coating layers only on the first limited sub-areas of the surface of the substrate and leaving the second limited sub-areas without coating layers as one of the at least two precursors is not available at the second sub-areas to give rise to film growth on the second sub-areas.

ALD is based on the principle of successive surface reactions of at least two precursors and thus the surface of the substrate is subjected alternatively to the at least two precursors for producing ALD coating layers on the surface of the substrate. According to the above mentioned the present invention is based on an idea of subjecting only the first limited sub-areas of a surface of the substrate to both or more than one precursors during the coating process. The precursors are supplied to the surface of the substrate with precursor nozzles. The first precursor is supplied with one or more first precursor nozzles and the second precursor with one or more second precursor nozzles. Subjecting only the first limited sub-areas of the surface of the substrate to successive surface reactions of at least a first and a second precursor may be carried out by moving the substrate relative to the first and/or second precursor nozzles. Alternatively the first limited sub-areas of the surface of the substrate may be subjected to successive surface reactions of at least a first and a second precursor by moving the substrate relative to the first and/or second precursor nozzles and simultaneously introducing the precursor supply to the surface of the substrate with intervals of interrupted precursor supply. This may be achieved by moving the substrate relative to at least one of the first precursor nozzle and the second precursor nozzle such that the movements of the first precursor nozzle and the second precursor nozzle over the surface of the substrate are overlapped only on the first limited sub-areas of the surface of the substrate for providing one or more coating layers on the first limited sub-areas. This may also be achieved by introducing the supply of at least one of the first precursor and the second precursor and simultaneously moving the substrate relative to at least one of the first precursor nozzle and second precursor nozzle such that only the one or more first limited sub-areas are subjected to both the first precursor and the second precursor. Accordingly the rest of the surface of the substrate or second limited sub-areas are subjected to only first or second precursor or neither of the first and second precursor.

An advantage of the present invention is that it enables providing ALD coating layers only first limited sub-areas of a surface of the substrate without additional process steps carried out before or after the coating process. Accordingly in the present invention the coating layers are formed only on the predetermined first limited sub-areas of the surface of the substrate. This means that only these first limited sub-areas are subjected to successive surface reactions of the at least first and second precursor. The method and apparatus of the present invention enable providing sharp edged coated sub-areas in an efficient manner. Thus the present invention provides a simple and efficient process for industrial scale manufacturing.

BRIEF DESCRIPTION OF THE DRAWINGS

In the following the invention will be described in greater detail by means of preferred embodiments with reference to the accompanying drawings, in which.

DETAILED DESCRIPTION OF THE INVENTION

The present invention relates to a coating method which may be implemented with an apparatus comprising at least one first precursor nozzle, at least one second precursor nozzle for supplying first precursor and second precursor, respectively, to a surface of a substrate, a precursor supply system for dosing the first precursor and second precursor to the first precursor nozzle and second precursor nozzle respectively, a moving system for moving the substrate relative to at least one of the first precursor nozzle and second precursor nozzle for subjecting the surface of the substrate to successive surface reactions of the at least the first precursor and the second precursor and a control system for controlling the coating process. In the context of this application detailed description and drawings of precursor supply system is omitted as it may be implemented in numerous ways. Basically the precursor supply system comprises gas sources, conduits, pumps and valves for delivering precursors. The apparatus may comprise vacuum pumps for operating the apparatus in vacuum environment in the reaction chamber. The vacuum pumps may be omitted if method and apparatus are operated at normal air pressure. In the context of this application also a very detailed description of moving system for moving the substrate(s) and precursor nozzles or nozzle head is omitted as also they may be implemented in various different ways. The operation of the apparatus may be controlled with a control system which may comprise several different electrical components, a control unit, such as a computer using control software, and other necessary components. The present invention is not limited to any specific precursor supply system, moving system or control system, but the present invention provides an operating method and apparatus for implementing the operating method.

Figure 1:
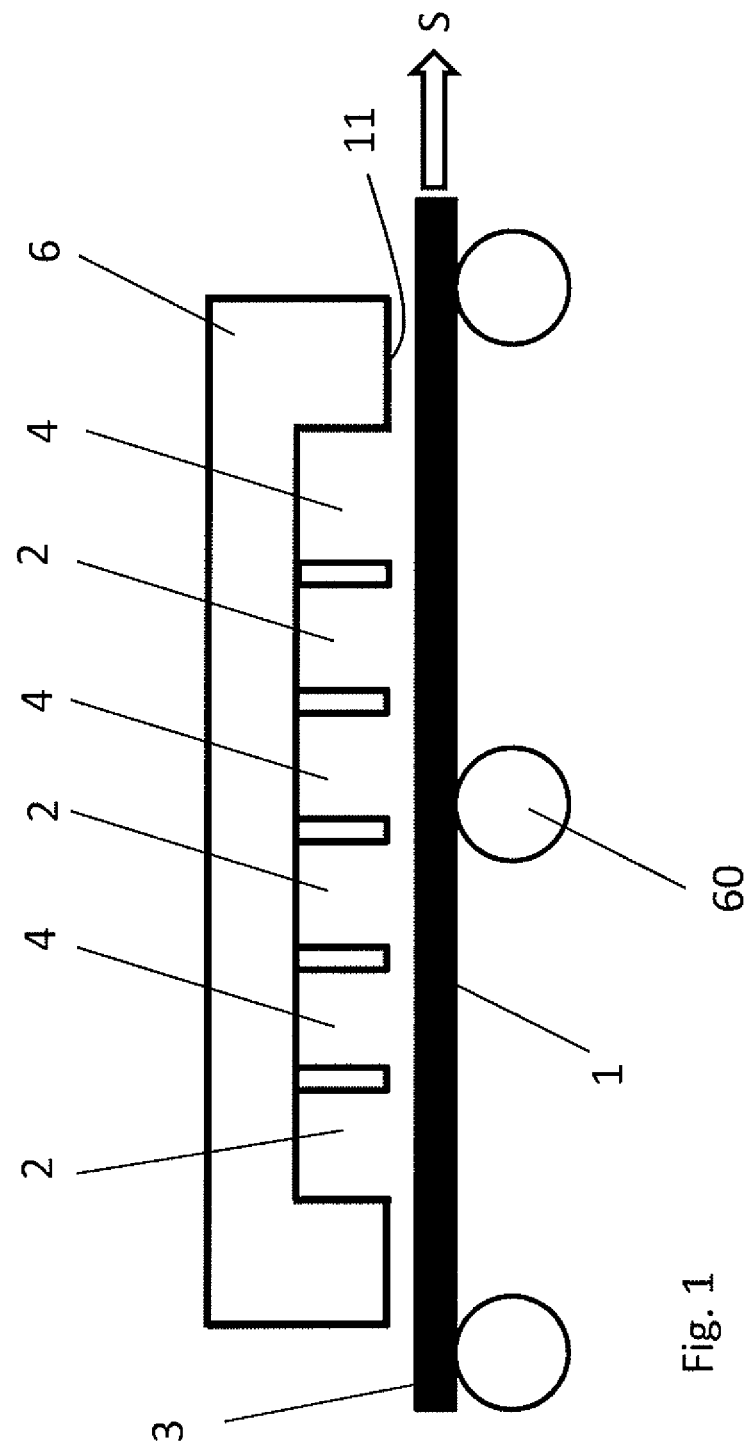
FIG. 1 is schematic view of an apparatus for implementing the present invention in one manner.

FIG. 1 shows schematically an apparatus for a coating process in which one or more coating layers are provided on a surface 3 of a substrate 1 by successive surface reactions of at least a first precursor and a second precursor according to the principles of atomic layer deposition. The apparatus comprises substrate moving means 60 which in this embodiment are transport rolls 60 on which the substantially planar substrate 1 is transported in the direction of arrow S. The apparatus further comprises a nozzle head 6 arranged over a surface 3, top surface, of the substrate 1. The nozzle head 6 comprises an output face 11 which is placed towards the surface 3 of the substrate 1. The output face 11 comprises first precursor nozzles 2 and second precursor nozzles 4 arranged alternately in the moving direction of the substrate 1. The nozzle head 6 or the apparatus may comprise at least one first precursor nozzle 2 and at least one second precursor nozzle 4. The first precursor nozzle 2 is arranged to supply first precursor on the surface 3 of the substrate and the second precursor nozzle 4 is arranged to supply second precursor on the surface 3 of the substrate 1. It should be noted that the first precursor nozzle 2 and the second precursor nozzle 4 may be provided to the nozzle head 6 which is arranged to be moved in relation to the substrate 1 with the moving system so as the first precursor nozzle 2 and the second precursor nozzle are stationary in relation to each other. Alternatively the first precursor nozzle 2 and the second precursor nozzle 4 may be separate parts which are arranged to be moved independently with the moving system, and possibly also in relation to each other.

In the embodiment of FIG. 1 it is shown one operating mode of the apparatus in which the nozzle head 6, and thus the first and second precursor nozzles 2, 4, are kept stationary and the substrate 1 is transported at constant speed in the direction of arrow S under the nozzle head 6. Alternatively the nozzle head 6 could be transported at constant speed over the surface 3 of the substrate 1 or the nozzle head 6 and the substrate 1 could be transported at different constant speed in the same of opposite directions. In other words the substrate 1 is moved in relation to the nozzle head 6, and the first and second precursor nozzles 2, 4, with the moving system of the apparatus. Moving the substrate 1 in relation to the nozzle head 6, or the first and second precursor nozzle 2, 4 enables the surface 3 of the substrate to be subjected to successive surface reactions of the first and second precursor supplied simultaneously and respectively from the first and second precursor nozzle 2, 4.

Figure 2:
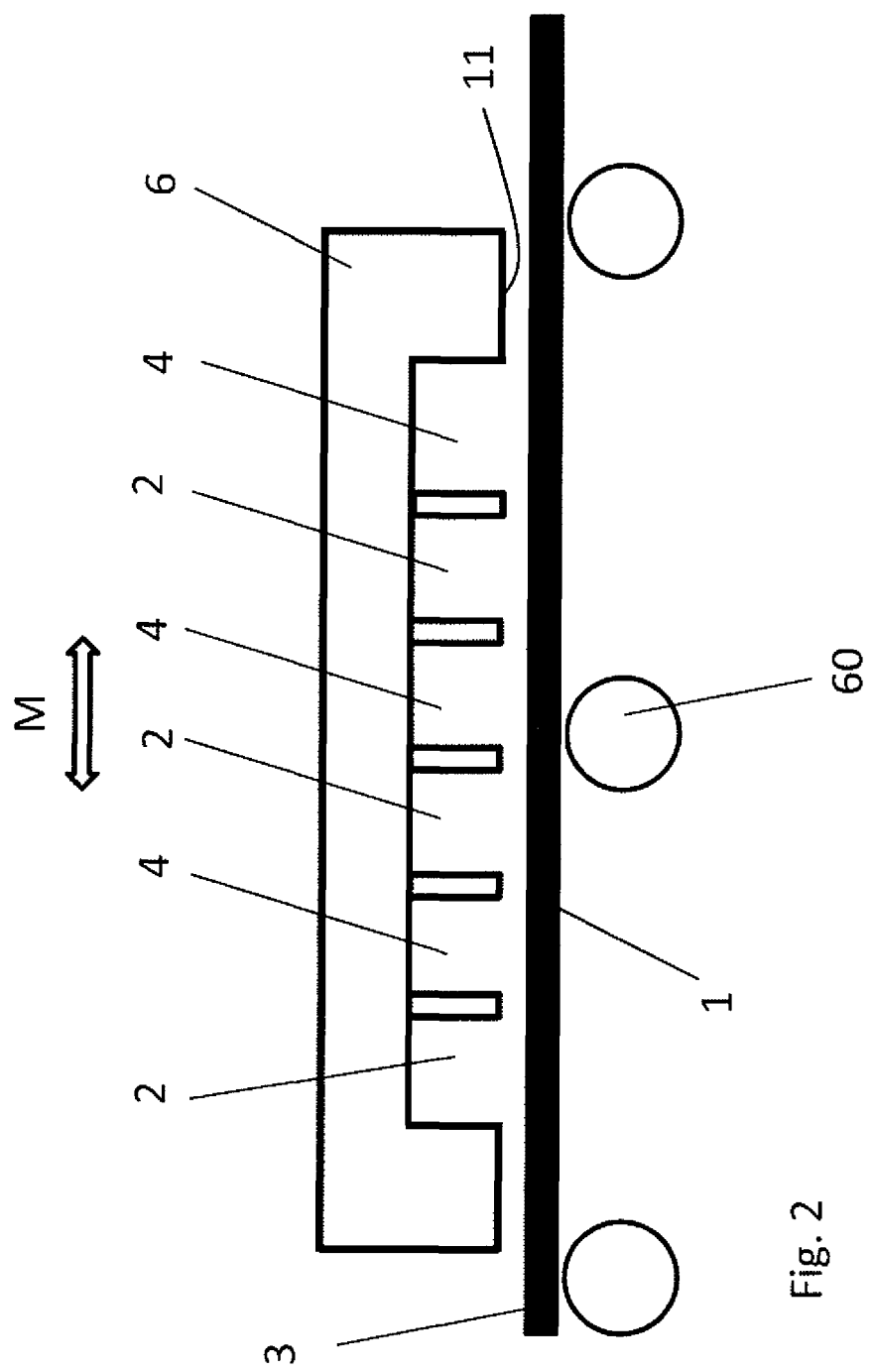
FIG. 2 is a schematic view of an apparatus for implementing the present invention in another manner.

FIG. 2 shows another operating mode of the moving system of the apparatus in which the substrate 1 is kept stationary and the nozzle head 6 is moved in reciprocating movement over the surface 3 of the substrate 1 in direction of arrow M. The reciprocating movement of the nozzle head 6, and the first and second precursor nozzle 2, 4 simultaneously subjects the surface 3 of the substrate 1 successively to first and second precursor supplied from the first and second precursor nozzle 2, 4. Alternatively the substrate 1 may be moved in reciprocating movement.

Figure 3:
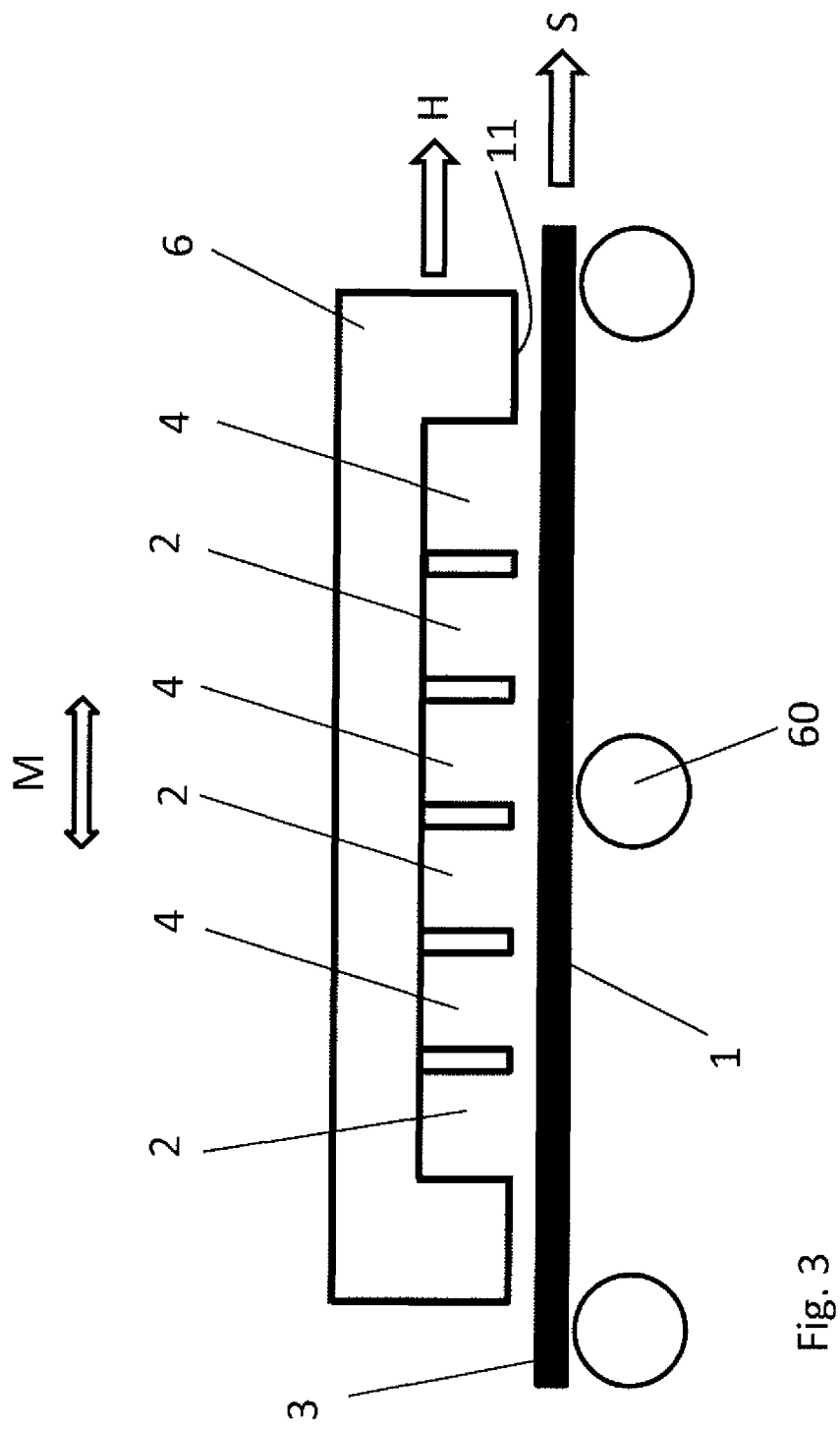
FIG. 3 is a schematic view of an apparatus for implementing the present invention in yet another manner.

FIG. 3 shows yet another operating mode of the moving system of the apparatus in which the substrate 1 and the nozzle head 6, and the first and second precursor nozzle 2, 4, are moved at same average speed in the same direction of arrows S and H. The nozzle head 6 is further moved in reciprocating movement over the surface 3 of the substrate 1 in direction of arrow M. The reciprocating movement of the nozzle head 6, and the first and second precursor nozzle 2, 4 simultaneously subjects the surface 3 of the substrate 1 successively to first and second precursor supplied from the first and second precursor nozzle 2, 4. According to this embodiment the nozzle head 6 follows movement of the substrate 1 and moves in the reciprocating movement at the same time. It should be noted that in alternative embodiment the substrate 1 may be moved in reciprocating movement and the nozzle head 6 only at constant speed.

The apparatus comprises a precursor supply system for dosing the first precursor and second precursor to the first precursor nozzle 2 and second precursor nozzle 4 respectively. The apparatus also comprises moving system for moving the substrate 1 relative to at least one of the first precursor nozzle 2 and second precursor nozzle 4 for subjecting the surface 3 of the substrate 1 to successive surface reactions of the at least the first precursor and the second precursor supplied from the first and second precursor nozzle 2, 4. The apparatus further comprises a control system for controlling the coating process by simultaneously controlling the operation of the precursor system and the moving system. The control system is arranged to control the precursor supply system and the moving system in simultaneously co-operation for providing one or more coating layers only on first limited sub-areas of the surface 3 of the substrate 1 and leaving one or more second limited sub-areas of the surface 3 of the substrate 1 without coating layers by synchronised supply of the first precursor and the second precursor from the first precursor nozzle 2 and the second precursor nozzle 4, respectively, and simultaneous movement of the substrate 1 relative to at least one of the first precursor nozzle 2 and second precursor nozzle 4. In other words only the first limited sub-areas of the surface 3 of the substrate 1 are subjected to successive surface reactions of the first and second precursor by controlling the precursor supply and simultaneously the relative movement of the first and second precursor nozzles 2, 4 and the substrate in relation to each other.

Figure 4:
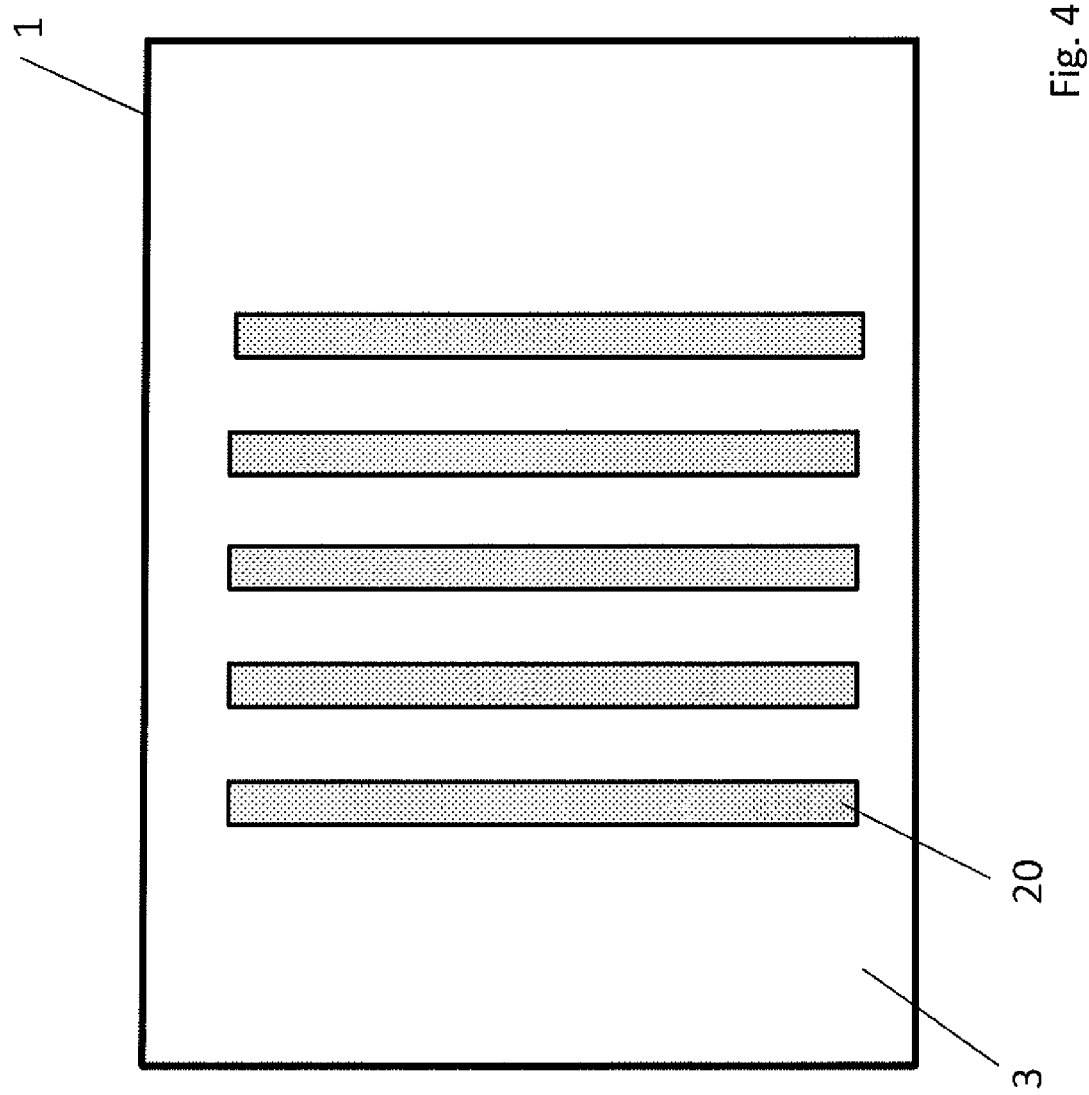
FIG. 4 shows schematically coating layers provided on limited sub-areas of a surface of a substrate with the apparatus and operation mode of FIGS. 1 to 3.

FIG. 4 shows a substrate 1 having only the first limited sub-areas 20 of the surface 3 coated with atomic layer deposition according to the present invention using the apparatus of FIGS. 1 to 3 and by controlling the precursor supply and simultaneously the relative movement of the first and second precursor nozzles 2, 4 and the substrate in relation to each other.

In the operating mode of FIG. 1 the first limited sub-areas 20 of the surface 3 of the substrate 1 are coated by introducing the supply of at least one of the first precursor and the second precursor with the precursor supply system and simultaneously moving the substrate 1 relative to the first precursor nozzle 2 and second precursor nozzle 4 with the moving system such that only the one or more first limited sub-areas 20 are subjected to both the first precursor and the second precursor. Specifically in the FIG. 1 the first limited sub-areas 20 of the surface 3 of the substrate 1 are coated by moving the substrate 1 relative to the first precursor nozzle 2 and second precursor nozzle 4 at constant speed and simultaneously introducing the supply of at least one of the first precursor and the second precursor such that only the one or more first limited sub-areas 20 are subjected to both the first precursor and the second precursor. The relative movement of the nozzle head 6 and the substrate 1 and the simultaneous supplying or introducing of the first and second precursor is controlled with the control unit. In this embodiment the first and second precursors are supplied or dosed to the surface of the 3 of the substrate 1 when the first and second precursor nozzle 2, 4, respectively, are over the first limited sub-areas 20 of the surface 3 of the substrate 1. Thus the supply or dosing of the first and second precursor is interrupted between the first limited sub-areas 20. It should be noted that the both first and second precursor supply may be introduced or pulsed or alternatively only one of the first and second precursor supply may be introduced or pulsed, as the coating layers form only on locations of the surface 3 which are subjected to both precursors. Pulsing the precursor supply means that precursor or precursors are supplied from the first and/or second precursor nozzle in predetermined intervals and possibly also predetermined duration. Thus pulsing is one specific manner for introducing precursors.

In the operating mode of FIGS. 2 and 3 the first limited sub-areas 20 of the surface 3 of the substrate 1 are coated by moving the substrate 1 relative to the first precursor nozzle 2 and second precursor nozzle 4 in reciprocating movement with the moving system and simultaneously introducing the supply of at least one of the first precursor and the second precursor with the precursor supply system such that only the one or more first limited sub-areas 20 are subjected to both the first precursor and the second precursor. The relative movement of the nozzle head 6 and the substrate 1 and the simultaneous supplying or introducing of the first and second precursor is controlled with the control unit. In this embodiment the first and second precursors are supplied or dosed to the surface of the 3 of the substrate 1 when the first and second nozzle head 2, 4, respectively, are over the first limited sub-areas 20 of the surface 3 of the substrate 1 during the simultaneous reciprocating movement. Thus the supply or dosing of the first and/or second precursor is interrupted between the first limited sub-areas 20, or when the first and/or second precursor nozzle 2, 4 are over the one or more second limited sub-areas where coating layers are not formed. It should be noted that the both first and second precursor supply may be pulsed, or alternatively only one of the first and second precursor supply may be pulsed, as the coating layers form only on locations of the surface 3 which are subjected to both precursors.

In FIGS. 2 and 3 the reciprocating movement or oscillating movement is shown as linear reciprocating movement. However, in alternative embodiment the first limited sub-areas 20 may be coated by moving the substrate 1 relative to at least one of the first precursor nozzle 2 and the second precursor nozzle 4 along a curved or looped coating path with the moving system and simultaneously introducing the supply of at least one of the first precursor and the second precursor with the precursor supply system such that only the one or more first limited sub-areas 20 are subjected to both the first precursor and the second precursor. Furthermore, it should be noted that in all of the embodiments of FIGS. 1 to 3 the nozzle head 6 may be replaced with separate precursor nozzles 2, 4 which may be moved independently such that they are moved similarly together, meaning that they are stationary in relation to each other, or differently, meaning that they are moved relatively to each other.

Figure 5:
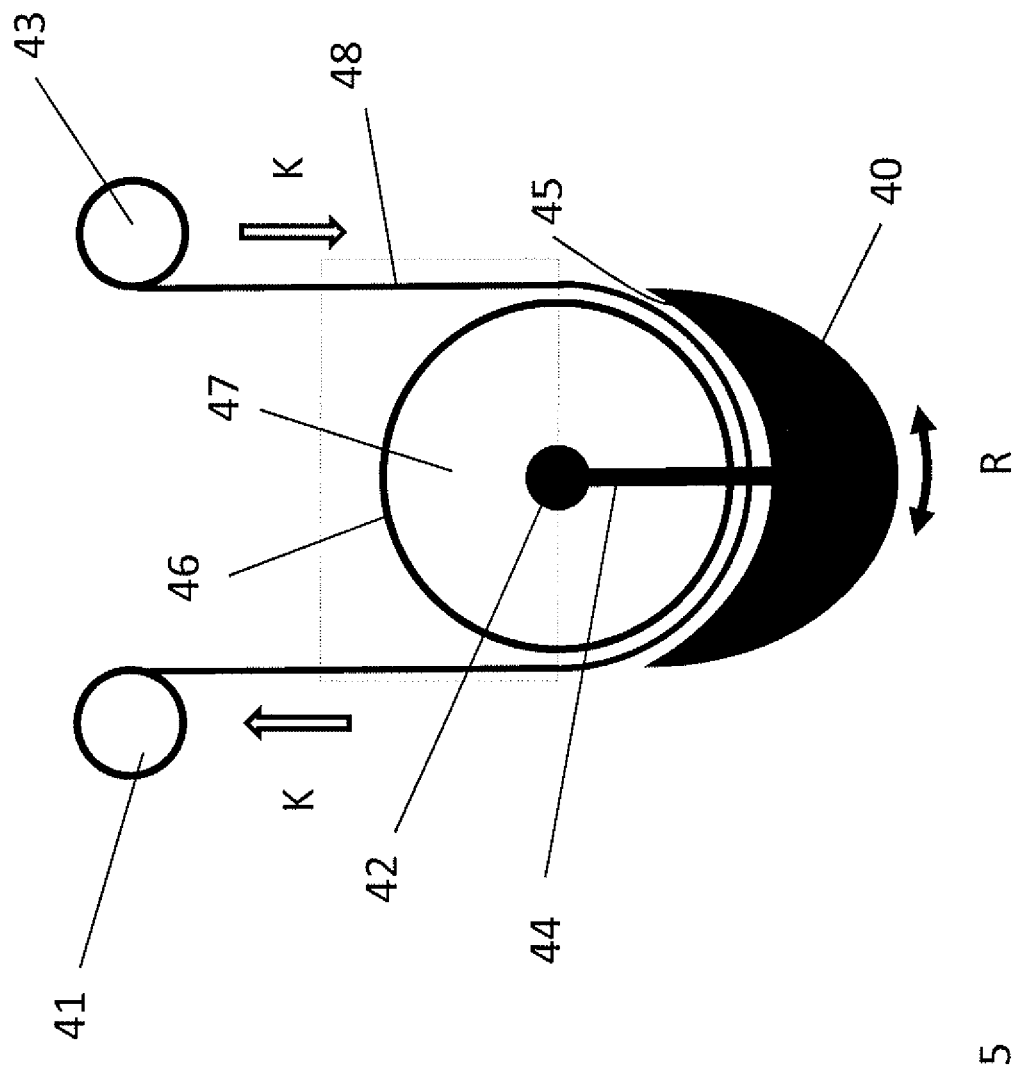
FIG. 5 is a schematic view of another apparatus for implementing the present invention.

FIG. 5 shows an alternative embodiment of the apparatus in which a substrate 48 is transported with the moving system having substrate moving means in which the substrate 48 is transported on the outer surface 46 of the transport cylinder 47 from a first substrate roll 43 to second substrate roll 41 in direction of arrows K. The substrate 48 may be transported along the outer surface 46 of the transport cylinder 47 by rotating the transport cylinder 47 or separate transport elements on the outer surface 46 with a same speed as substrate 48 is transported. Alternatively the transport cylinder 48 is provided with a slide surface on the outer surface 47 such that the substrate 48 may slide along the outer surface 46 while moving the substrate 48 is carried out by rotating the first and second substrate roll 43, 41. The apparatus is further provided with a nozzle head 40 arranged in connection with the transport cylinder 47. The nozzle head 40 comprises an output face 45 provided with the first and second precursor nozzles, as described above. The output face 45 of the nozzle head 40 is formed conform a portion of a cylindrical outer surface 46, as shown in FIG. 5. The nozzle head 40 is positioned over the substrate 48 and outer surface 46 such that there is gap between the output face 45 and the outer surface 46, transport surface. In an alternative embodiment a nozzle head may be rotated around a rotation axis and precursors are introduced from the outer surface of the nozzle head. In this embodiment the substrate is provided to move over the outer surface of the nozzle head. The nozzle head may be a cylindrical nozzle head and the substrate may be arranged to be moved over at least part of the cylindrical outer surface of the nozzle head through which the precursors are introduced.

The apparatus comprises a moving system having nozzle head moving means for moving the nozzle head 40 in relation to the transport cylinder 47 and substrate 48. The moving mechanism is arranged to move the nozzle head 2 in a reciprocating or oscillating swing movement between a first end position and a second end position around the central axis 42 of the transport cylinder 47, as shown with arrow R in FIG. 5. The apparatus of FIG. 5 may be operated in the same three operating modes as the apparatus shown FIGS. 1 to 3. Thus the substrate nozzle head 40 may be stationary in relation to the substrate 48 or it may be moved in reciprocating, or oscillating swing, movement around the axis 42 and the supply of the first and second precursors from the first and second precursor nozzle may be introduced as described above.

The above embodiments of the present invention are based on the idea in which the control system is arranged to introduce or feed the supply of at least one of the first precursor and the second precursor by controlling the precursor supply system and simultaneously move the substrate 1, 48 relative to at least one of the first precursor nozzle 2 and second precursor nozzle 4 or the nozzle head 6, 40 by controlling the moving system such that only the one or more first limited sub-areas 20 are subjected to both the first precursor and the second precursor. In other words in the above described embodiments at least one of the first and second precursor supply is introduced such that the at least one of the first and second precursors is supplied to the surface 3 of the substrate 1 only on the first limited sub-areas of the surface 3. The introducing of at least one of the precursors is such that precursor is supplied only when the precursor nozzle is over the predetermined first limited sub-area of the surface of the substrate.

In an alternative embodiment the apparatus of FIG. 5 may be modified such that the transport cylinder 47 is provided as a nozzle head having at least one first and one second precursor nozzle on provided on the outer surface 46 of the cylinder. The nozzle head of FIG. 5 is further formed as a substrate support supporting the substrate as it is transported between the substrate rolls 41, 43. The transport movement of the substrate 48 with the substrate rolls 41, 43 and the substrate support 40 in relation to the nozzle head cylinder 47 is controlled together with the supply of the precursors from precursor nozzles of the nozzle head cylinder 47 such that only the one or more first limited sub-areas are subjected to both the first precursor and the second pre-cursor. The nozzle head cylinder may be rotated, for example continuously in one direction, intermittently or in reciprocating manner in opposite rotation directions around the central axis 42. The substrate 48 may also be transported continuously from one substrate roll 41 to another substrate toll 42 continuously, intermittently or in reciprocating manner. The movement of the substrate 48 and the nozzle head cylinder 47 are controlled together with the supply of the precursors in the similar manner as described above such that the at least one of the first and second precursors is supplied to the surface of the substrate only on the first limited sub-areas of the surface, or the only the first limited sub-areas are subjected to both the first and second precursors.

Figure 6:
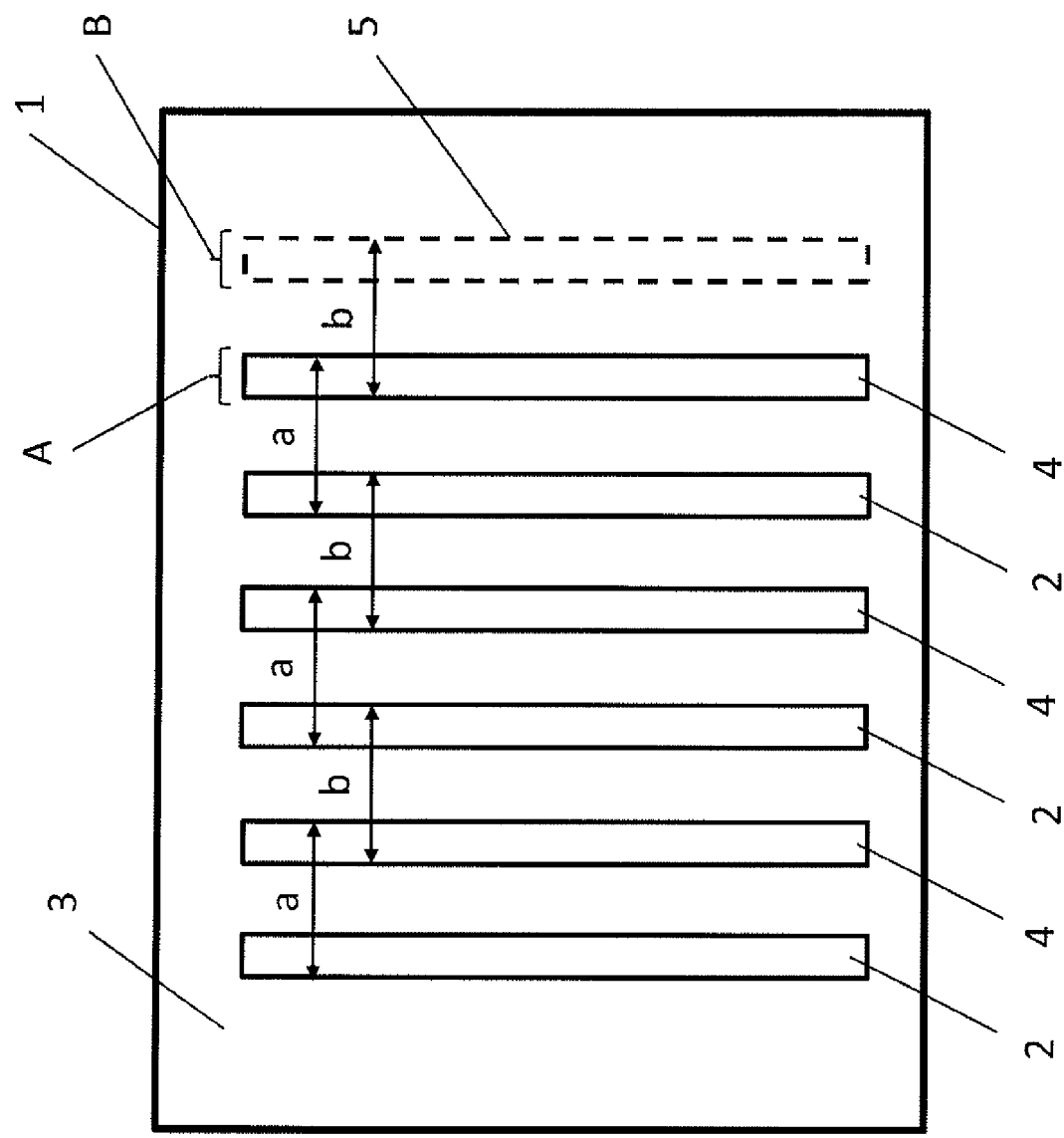
FIG. 6 is a schematic presentation of one operation mode of the apparatus of FIGS. 2 and 3.

FIG. 6 shows schematically an alternative embodiment of the present invention in which the substrate 1 is moved relative to at least one of the first precursor nozzle 2 and the second precursor nozzle 4 such that the movements of the first precursor nozzle 2 and the second precursor nozzle 4 over the surface 3 of the substrate 1 are overlapped only on the first limited sub-areas of the surface 3 of the substrate 1 for providing one or more coating layers on the first limited sub-areas. In other words the precursor supply is not introduced intermittently, but the precursors are supplied continuously from the first and second precursor nozzle 2, 4. As shown in FIG. 6 the substrate 1 and the first precursor nozzle 2 and the second precursor nozzle 4 are moved in reciprocating, or oscillating, movement in relation to the substrate 1 between a first relative position A and a second relative position B over the surface 3 of the substrate 1 such that the reciprocating movements of the first precursor nozzle 2 and the second precursor nozzle 4 are overlapped on the first limited sub-areas over the surface 3 of the substrate 1. In the embodiment FIG. 6, the first and second precursor nozzle 2, 4 are stationary in relation to each other and are thus moved together with the precursor nozzle moving means or nozzle head moving means of the moving system. The first and second precursor nozzle 2, 4 may be separate precursor nozzles or they may be provided to a nozzle head. The first precursor nozzle 2 is moved in reciprocating movement a distance a between the first relative position A and the second relative position B. Similarly the second precursor nozzle 4 is moved in reciprocating movement a distance b between the first relative position A and the second relative position B. The relative positions A and B are shown only for the second precursor nozzle 4 on the right in FIG. 6. The first relative position A may be starting position and the second relative position B, shown in dotted lines, the end position 5 of the reciprocating movement. In this embodiment the distance a and b are equal, but in alternative embodiment the distances a and b may also be unequal such that the reciprocating movements of the adjacent first precursor nozzle 2 and the second precursor nozzle 4 overlap on the first limited sub-areas. As shown in FIG. 6 the coating is formed only on the first limited sub-areas in which the movements of the first and second precursor nozzle 2, 4 are overlapped on the surface 3 of the substrate 1, meaning areas where the arrows a and b are overlapped in FIG. 6. In other words the movements of the first and second precursor nozzle 2, 4 cause the deposition of the first and second precursor overlap only on the first limited sub-areas of the surface 3 of the substrate 1.

In the embodiment of FIG. 6 the first precursor nozzle 2 and the second precursor nozzle 4 are moved in reciprocating movement in relation the substrate 1 between a first relative position A and a second relative position B over the surface 3 of the substrate 1 such that the second relative position B of the first precursor nozzle 2 substantially overlaps the first relative position A of the second precursor nozzle 4 during the reciprocating movement for subjecting the surface 3 of the substrate 1 to both the first precursor and the second precursor at the one or more first limited sub-areas provided by the overlapped regions of the first and second relative positions A, B. Thus the shape of the precursor nozzles 2, 4 have an effect on the shape of the coated first limited sub-areas. The first precursor nozzle 2 and the second precursor nozzle 4 may also be moved in reciprocating movement in relation the substrate 1 between a first relative position A and a second relative position B over the surface 3 of the substrate 1 such that the second relative position B of the first precursor nozzle 2 only partly overlaps the first relative position A of the second precursor nozzle 4. Thus different coated first limited sub-areas may be formed. Adjusting the length of the movement of the first and second precursor nozzle, the width of the coated limited sub-areas may be adjusted. The overall width a pair of the adjacent first and second precursor nozzle 2, 4 defines the maximum width of the coated limited sub-areas. This is achieved by moving the first and second precursor nozzles 2, 4 and simultaneously supplying the precursors via the precursor nozzles 2, 4.

Figure 7:
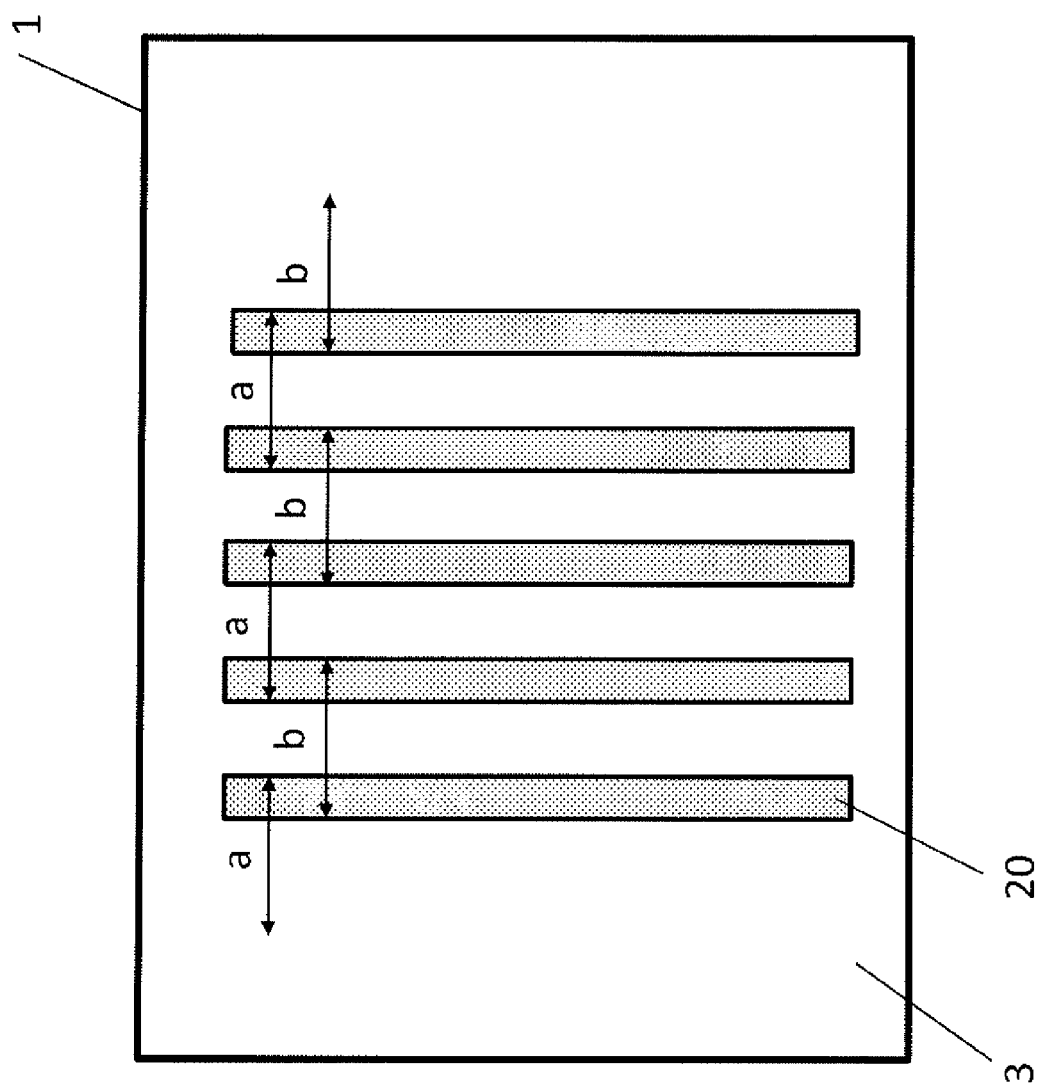
FIG. 7 shows schematically coating layers provided on limited sub-areas of a surface of a substrate.

FIG. 7 shows the coated first limited sub-areas 20 formed by the apparatus and operating mode and method described in connection with FIG. 6. FIG. 7 clearly demonstrates that the coating is formed only on the limited sub-areas 20 where the reciprocating movement, distances a and b, of the first and second precursor nozzle 2, 4 are overlapped over the surface 3 of the substrate 1. The 3 surface of the substrate 1 is thus subjected to both the first and second precursor only on these overlapped where the reciprocating movements of the first and second precursor nozzle 2, 4 are overlapped. In this embodiment the limited first sub-areas are stripes, but alternative they may be any geometrical or predetermined shapes. This is achieved by moving the first and second precursor nozzles 2, 4 and simultaneously supplying the precursors via the precursor nozzles 2, 4.

Figure 8:
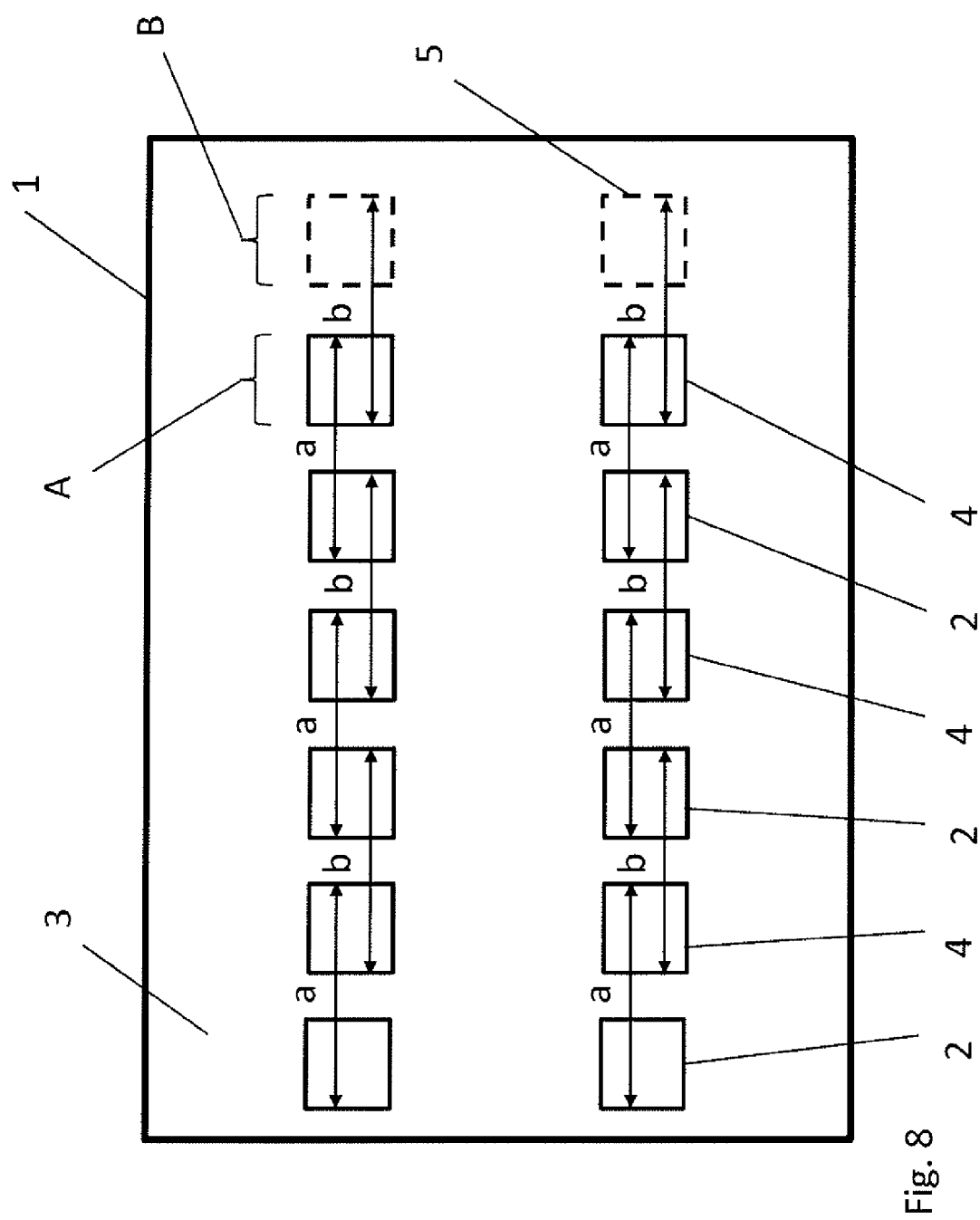
FIG. 8 is a schematic presentation of one operation mode of an apparatus for producing coating layers on limited sub-areas of a surface of a substrate.
Figure 9:
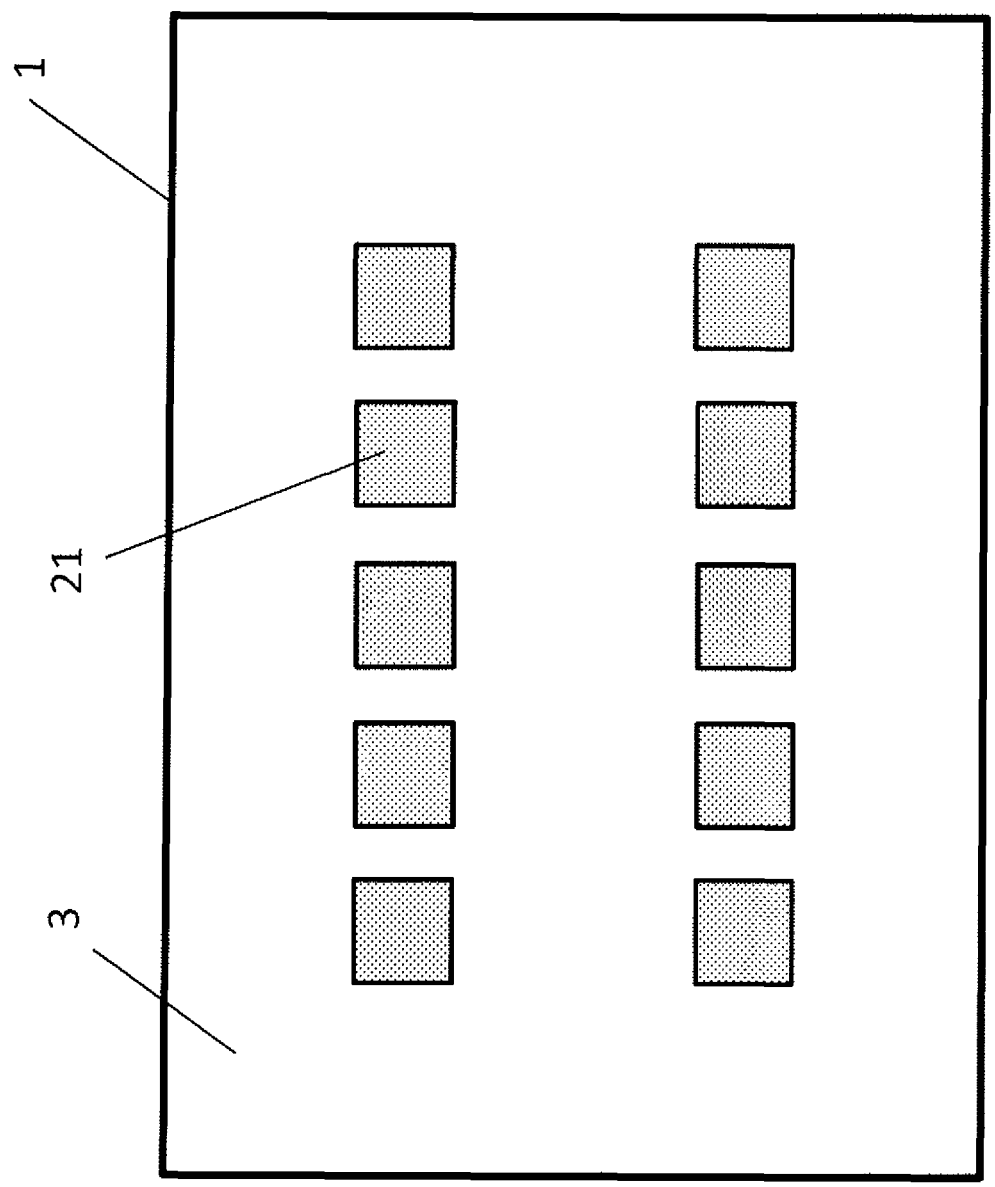
FIG. 9 shows schematically coating layers provided on limited sub-areas of a surface of a substrate with the apparatus and operation mode of FIG. 8.

FIGS. 8 and 9 show schematically an alternative embodiment which corresponds the embodiment of FIGS. 6 and 7. In this embodiment the first and second precursor nozzles 2, 4 have different shape and there are also two rows of precursor nozzles 2, 4 for forming two rows of coated first limited sub-areas on the surface 3 of the substrate 1. As shown in FIG. 8 the substrate 1 and the first precursor nozzles 2 and the second precursor nozzles 4 are moved in reciprocating, or oscillating, movement in relation to the substrate 1 between a first relative position A and a second relative position B over the surface 3 of the substrate 1 such that the reciprocating movements of the first precursor nozzle 2 and the second precursor nozzle 4 are overlapped on the first limited sub-areas over the surface 3 of the substrate 1. The first precursor nozzle 2 is moved in reciprocating movement a distance a between the first relative position A and the second relative position B. Similarly the second precursor nozzle 4 is moved in reciprocating movement a distance b between the first relative position A and the second relative position B. The relative positions A and B are shown only for the second precursor 4 on the right in FIG. 6. The first relative position A may be starting position and the second relative position B, shown in dotted lines, the end position 5 of the reciprocating movement. As shown in FIG. 8 the coating is formed only on first limited sub-areas in which the movements of the first and second precursor nozzle 2, 4 are overlapped on the surface 3 of the substrate 1, meaning areas where the arrows a and b are overlapped in FIG. 8. FIG. 7 shows the coated first limited sub-areas 20 formed by the apparatus and operating mode and method described in connection with FIG. 6. FIG. 7 clearly demonstrates that the coating is formed only on the first limited sub-areas where the reciprocating movement, distances a and b, of the first and second precursor nozzle 2, 4 are overlapped over the surface 3 of the substrate 1. The 3 surface of the substrate 1 is thus subjected to both the first and second precursor only on these overlapped where the reciprocating movements of the first and second precursor nozzle 2, 4 are overlapped. FIG. 9 shows the coated first limited sub-areas 21 formed by the apparatus and operating mode and method described in connection with FIG. 8. FIG. 9 demonstrates that the coating is formed only on the first limited sub-areas 21 where the reciprocating movement, distances a and b, of the first and second precursor nozzle 2, 4 are overlapped over the surface 3 of the substrate 1 as the precursors are supplied simultaneous with moving the first and second precursor nozzles 2, 4. In this embodiment the first limited sub-areas 21 are squares.

Figure 10:
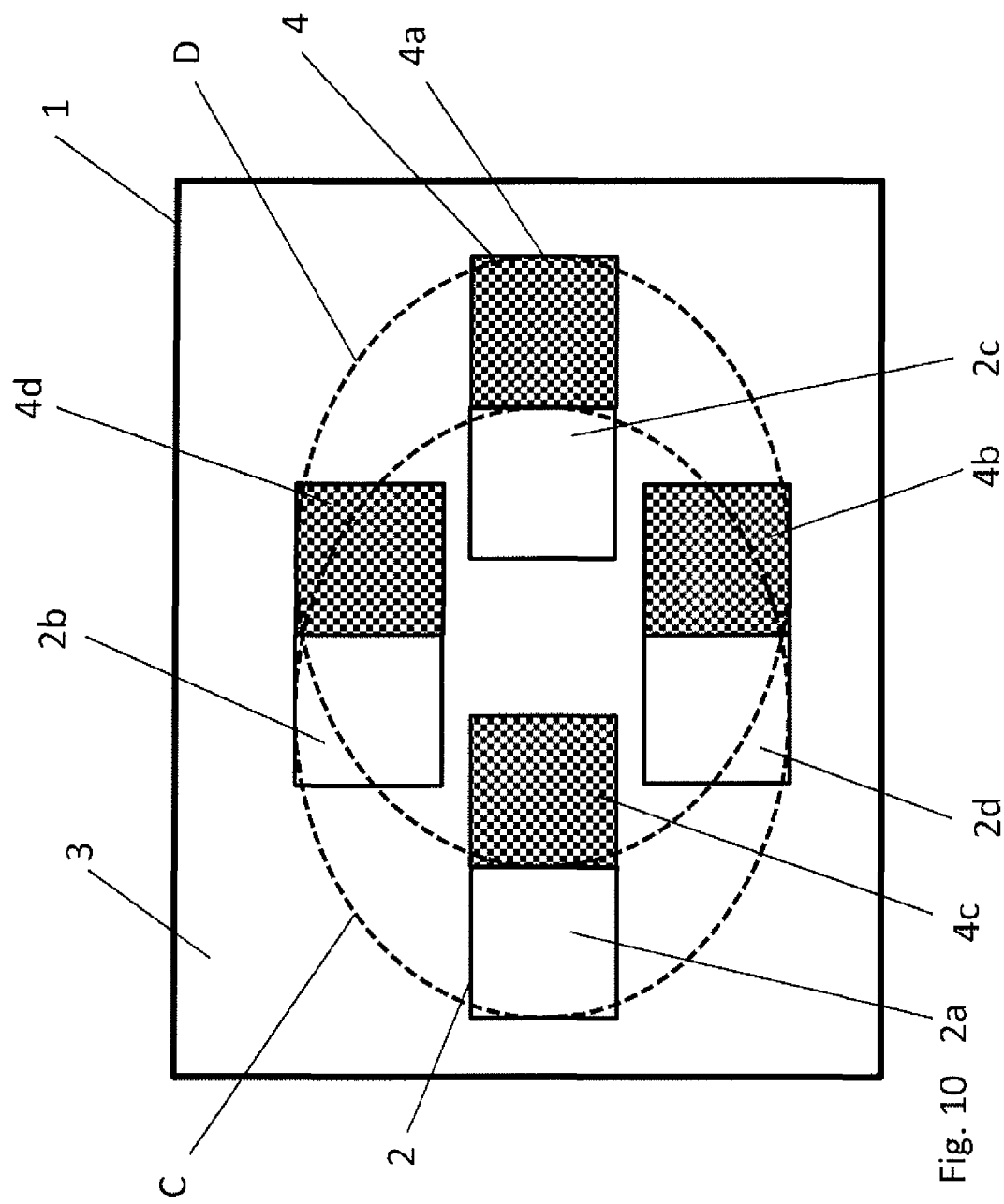
FIG. 10 shows a schematic presentation of one operation mode of another apparatus for producing coating layers on limited sub-areas of a surface of a substrate.

FIG. 10 shows yet another embodiment of the present invention in which the control system is arranged to move the first precursor nozzle 2 and the second precursor nozzle 4 or the nozzle head in relation to the substrate 1 along a curved or a loop coating path C, D other over the surface 3 of the substrate 1 by controlling the moving system such that the curved coating paths C, D of the first precursor nozzle 2 and the second precursor nozzle 4 are overlapped on the first limited sub-areas over the surface 3 of the substrate 1. In FIG. 10 the first precursor nozzle 2 is moved along an elliptical first coating path C. The position of the first precursor nozzle 2 along the first coating path C is shown in positions 2a, 2b, 2c and 2d. The second precursor nozzle 4 is moved along an elliptical first coating path D. The position of the first precursor nozzle 4 along the first coating path D is shown in positions 4a, 4b, 4c and 4d. As shown in FIG. 10 the first and second coating paths C and D are overlapped on the surface 3 of the substrate 1 and thus the coated first limited sub-areas are formed on these overlapped areas. This is achieved by moving the first and second precursor nozzles 2, 4 and simultaneously supplying the precursors via the precursor nozzles 2, 4. In FIG. 10 the first and second coating paths have equal shape, but alternatively they may also be different when the first and second precursor nozzle 2, 4 are separate and may be moved independently. Furthermore, the precursor nozzles 2, 4 may also be provided to a nozzle head. The shape of the curved coating paths C, D may have any possible shape such as circular, elliptical, curved line, arc, and thus the curved coating path may also be provided as reciprocating movement.

Figure 11:
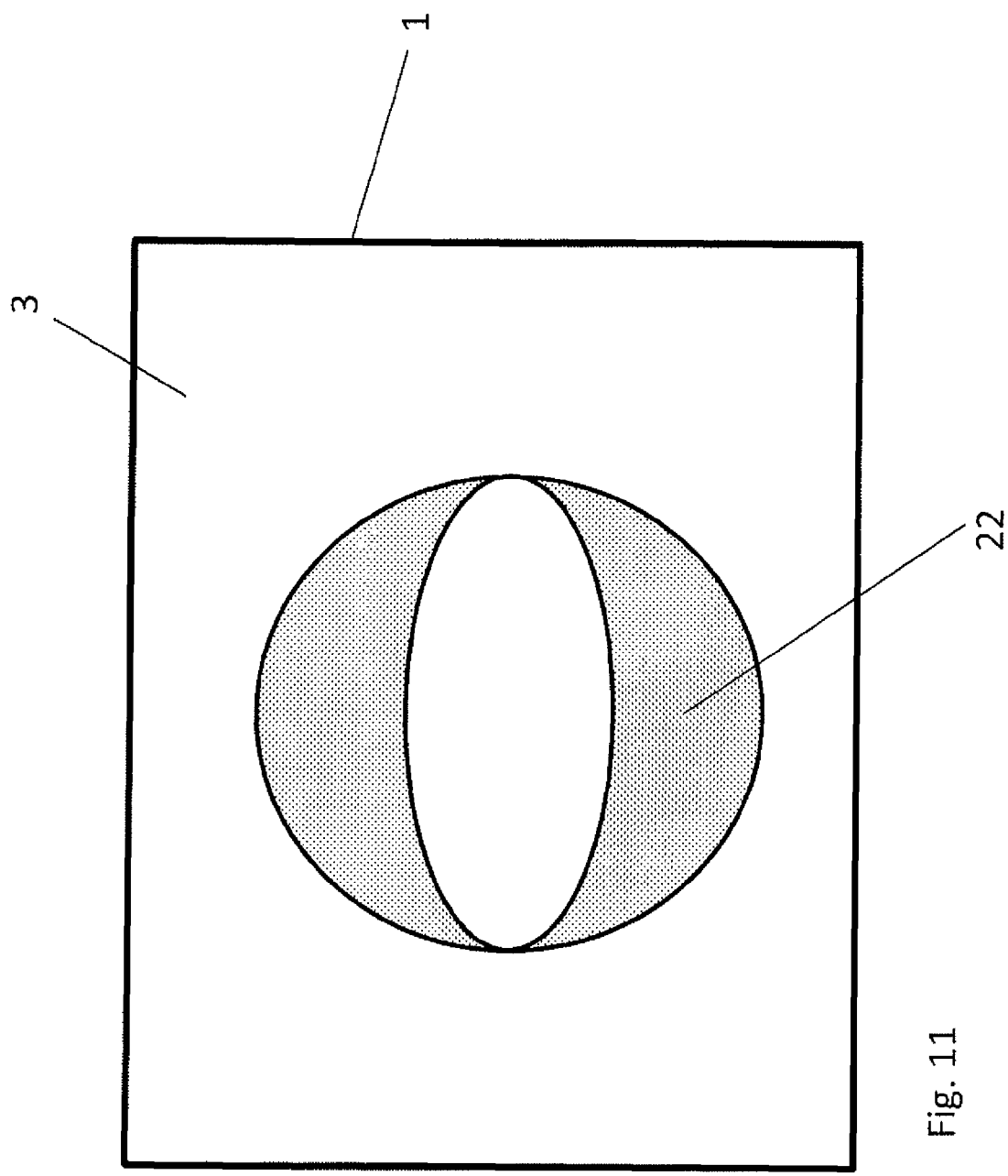
FIG. 11 shows schematically coating layers provided on limited sub-areas of a surface of a substrate with the apparatus and operation mode of FIG. 10.

FIG. 11 shows the coated first limited sub-areas 22 formed by the apparatus and operating mode and method described in connection with FIG. 10. FIG. 11 demonstrates that the coating is formed only on the first limited sub-areas 21 where curved coating paths C, D of the first and second precursor nozzle 2, 4 are overlapped over the surface 3 of the substrate 1. This is achieved by moving the first and second precursor nozzles 2, 4 and simultaneously supplying the precursors via the precursor nozzles 2, 4.

In some embodiments the present invention the movements, movement patterns or coating paths of the first and second precursor may overlap on the first limited sub-areas and the movements, movement patterns or the coating paths may be altered during the coating process for forming 3-dimensional coatings on the substrate. Altering the movements, movement patterns or coating paths changes the overlapped areas and thus the coated first limited sub-areas.

Figure 12:
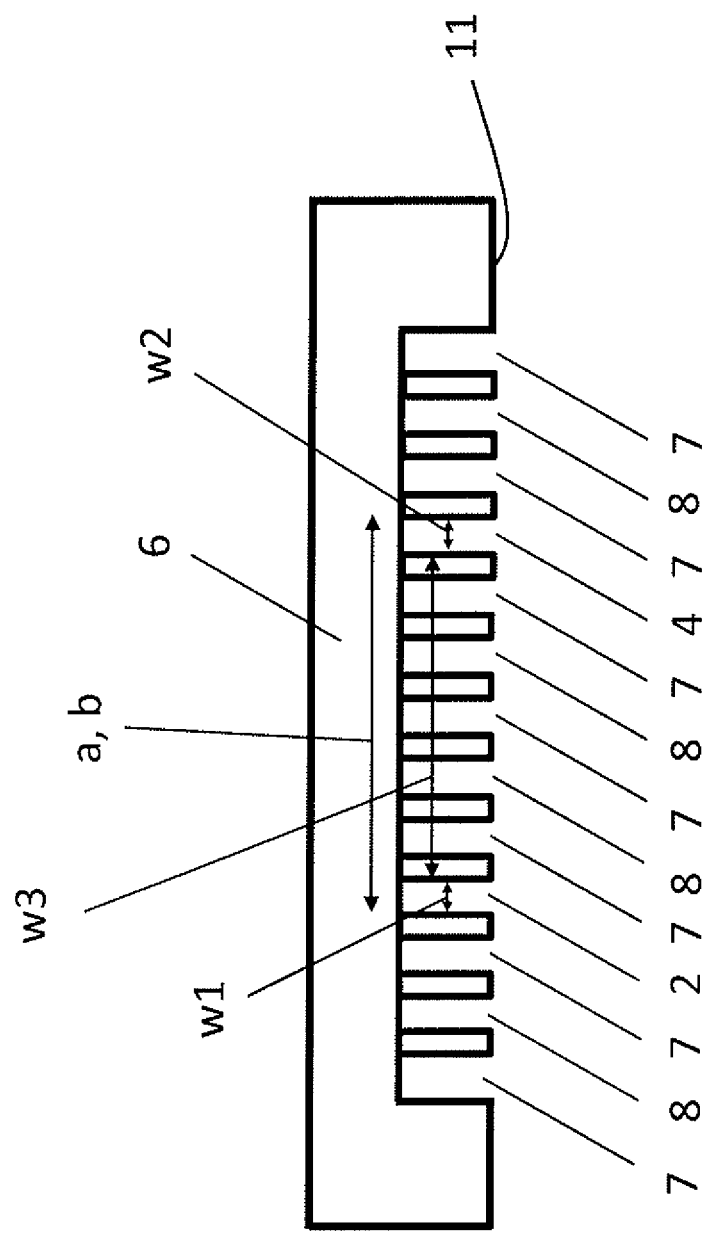
FIG. 12 shows a nozzle head for a nozzle head for implementing the present invention.

FIG. 12 shows a nozzle head 6 provided with a first precursor nozzle 2 supplying first precursor and a second precursor nozzle 4 supplying second precursor. The nozzle head 6 is further provided with purge gas nozzles 8 arranged to supply purge gas to the surface of the substrate for providing a gas curtain between the ambient atmosphere and the precursor nozzle 2, 4, and for purging excess precursors from the surface of the substrate. The nozzle head further comprises discharge nozzles 7 arranged to discharge excess precursors and purge gas from the surface of the substrate. In the embodiment of FIG. 12 the precursor nozzles 2, 4, purge gas nozzles 8 and discharge nozzles 7 are arranged as follows: 7, 8, 7, 2, 7, 8, 7, 8, 7, 4, 7, 8, 7. However, the precursor nozzles 2, 4, purge gas nozzles 8 and discharge nozzles 7 may also arranged be arranged differently such that the first and second precursor nozzles 2, 4 separated with one or more purge gas nozzles 8 and/or discharge nozzles 7. Furthermore, it should be noted that the purge gas nozzles 8 or the discharge nozzles 7, or at least some of them, may be omitted from the nozzle head 6. Additionally, it should be noted that the precursor nozzles 2, 4, purge gas nozzles 8 and discharge nozzles 7 may also be separate nozzles to be moved synchronized together or independently.

As shown in FIG. 12 the first precursor nozzle 2 has a first width w1 and the second precursor nozzle 4 has a second width w2 in the moving direction, and that the first precursor nozzle 2 and the second precursor nozzle 4 being arranged at a fixed distance w3 from each in the moving direction. In the reciprocating motion the first and second precursor 2, 4 are moved in relation to the substrate 1 a distance a, b, as described above. In order to provide coating on only the first limited sub-areas of the surface 3 of the substrate 1, the whole substrate cannot be subjected on the both the first and second precursors. Thus the first and second precursor nozzle 2, 4 has to be moved in the reciprocating movement such that they scan over the surface of the substrate and their movement is overlapped on the surface of the substrate on the first limited sub-areas as the precursors are supplied simultaneously with the movement of the precursor nozzles 2, 4. This sets the limits for the travelling length L, or distances a, b, which the first and second precursor nozzle 2, 4 travel during the reciprocating movement. In the operating mode of FIG. 12 the nozzle head 6 is moved in reciprocating movement in relation the substrate 1 by controlling the moving system such that the travelling length L of the nozzle head 6 in the reciprocating movement is $w3<L<2*w3+w1$ or $w3<L<2*w3+w2$, for subjecting the surface 3 of the substrate 1 to both the first precursor and the second precursor at the one or more first limited sub-areas provided by the overlapped regions of the first precursor nozzle 2 and the second precursor nozzle 4 over the surface 3 of the substrate 1. In other words the first precursor nozzle 2 and the second precursor nozzle 4 are moved in reciprocating movement in relation the substrate 1 and the first precursor nozzle 2 and second precursor nozzle 4 are kept stationary in relation to each other by controlling the moving system such that the travelling length L of the first precursor nozzle 2 and the second precursor nozzle 4 in the reciprocating movement is $w3<L<2*w3+w1$; or $w3<L<2*w3+w2$, for subjecting the surface 3 of the substrate 1 to both the first precursor and the second precursor at the one or more first limited sub-areas provided by the overlapped regions of the first precursor nozzle 2 and the second precursor nozzle 4 over the surface 3 of the substrate 1. Accordingly, to provide coating on a first limited sub-area the first precursor nozzle 2 and the second precursor nozzle has to be moved in reciprocating movement a travelling length L which is longer than the fixed distance w3 between the first and second precursor nozzle 2, 4 (L>w3) such that the movements of the first and second precursor nozzle 2, 4 are overlapped. On the other hand the travelling length L has to be shorter than the two times than the fixed distance w3 between the first and second precursor nozzle 2, 4 plus the width of the first and/or second precursor nozzle 2, 4 ($L<2*w3+w1/w2$) such that the movements of the first and second precursor nozzle 2, 4 are not overlapped on the whole surface of the substrate. In the embodiment of FIGS. 1 to 4 and 6 to 9, the first precursor nozzle 2 and the second precursor nozzle 4 are moved in reciprocating movement in relation the substrate 1 and the first precursor nozzle 2 and second precursor nozzle 4 are kept stationary in relation to each other such that the travelling length L of the first precursor nozzle 2 and the second precursor nozzle 4 in the reciprocating movement is substantially L=w3+w1, or L=w3+w2. In mentioned embodiment w1 is equal to w2.

Figure 13:
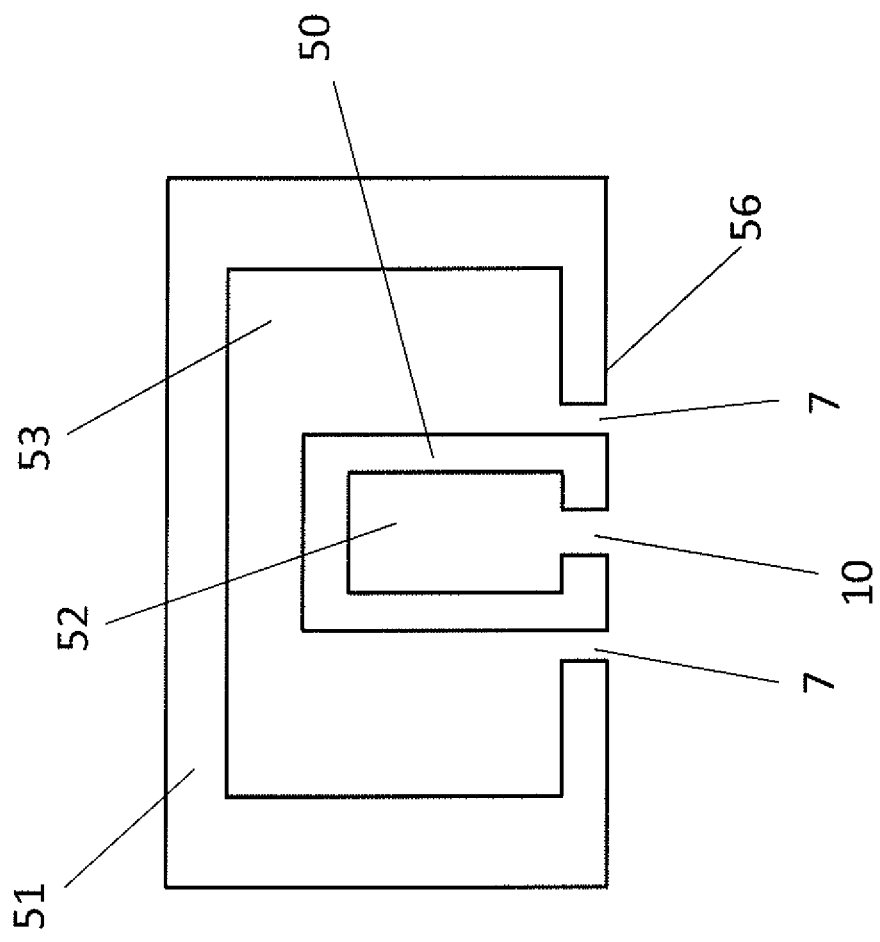
FIG. 13 shows a precursor nozzle for implementing the present invention.

FIG. 13 shows an embodiment of precursor nozzles 2, 4 which they may be provided to the nozzle head or may be separate precursor nozzles. It should be noted that in all embodiments of the present invention the nozzle head may be replaced by separate precursor nozzles which may be moved independently or together. The precursor nozzle comprises a precursor supply element 50 extending inside a discharge conduit 53 provided by discharge element 51. The precursor supply element 50 extends substantially in a nested fashion inside the discharge conduit 53, preferably substantially coaxially inside the discharge conduit 53. The precursor supply element 50 comprises a precursor conduit 52 and a precursor supply channel 10 opening on and along a nozzle output face 56 through which the precursor is supplied to the surface of the substrate. The precursor channel 10 divides the discharge conduit 53 into two discharge channels 7 on opposite sides of the precursor supply channel 10. Thus the precursor nozzle of FIG. 13 both supplies precursor material to the surface of the substrate and discharges excess precursor from the surface of the substrate.

Figure 14:
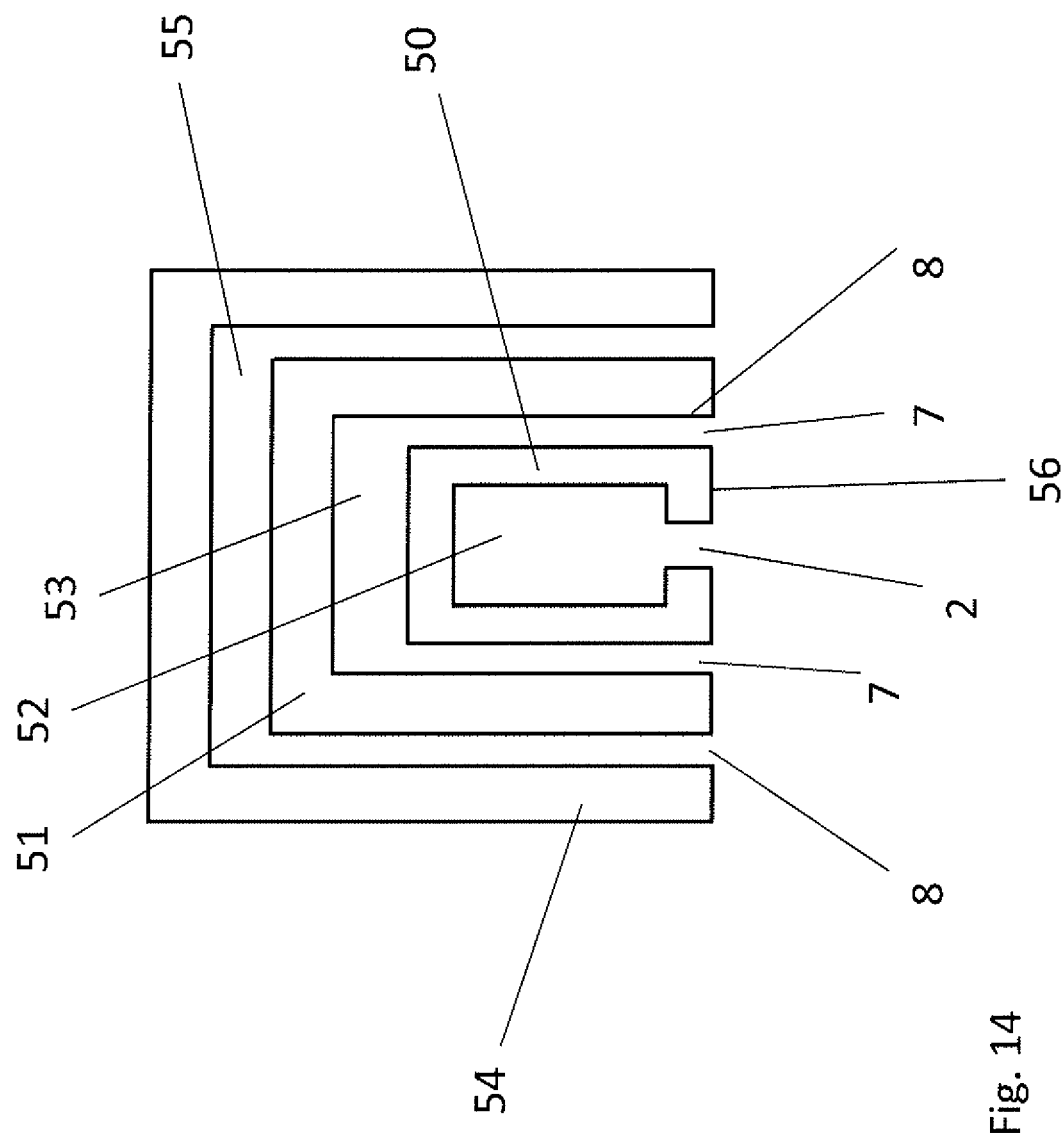
FIG. 14 shows another precursor nozzle for implementing the present invention.

FIG. 14 shows an alternative embodiment in which both the precursor supply channel 10 and the discharge channels 7 are arranged to extend longitudinally inside the purge gas element 54 such that they divide a purge gas channel in the longitudinal direction to purge sub-channels 8 and on opposite sides of the precursor supply element 50 and the discharge channels 7. The purge gas element also comprises a purge gas conduit 55 for supplying purge gas to the purge gas sub-channels 8. In this embodiment the precursor supply element 50 and the discharge element 51 forming the discharge channels 7 are nested inside the purge gas element 55 and purge gas conduit 56. Thus there is fluid connection between the purge gas sub-channels 8 via the purge gas conduit 56. The discharge conduit 53 may extends substantially in a nested fashion inside purge gas element 55, preferably substantially coaxially inside the purge gas conduit 56, at least in the lateral direction of the discharge channels 7. Thus the precursor nozzle of FIG. 14 supplies purge gas and precursor material to the surface of the substrate and discharges excess precursor and purge gas from the surface of the substrate.

To achieve the above mentioned coating of only the first limited sub-areas of the surface of the substrate according to the present invention the apparatus comprises a moving system comprising first nozzle moving means for moving the first precursor nozzle 2 and second nozzle moving means for moving the first precursor nozzle 4, or nozzle head moving means for moving the nozzle head or precursor nozzles 2, 4 fixed to each other. The moving system may further comprise substrate moving means for moving the substrate. Thus in the apparatus and method of the present invention the control system may be arranged to:

move the first precursor nozzle 2 and the second precursor nozzle 4 in relation to the substrate 1 and keep the first precursor nozzle 2 and the second precursor nozzle 4 stationary in relation to each other by controlling the moving system; or move the nozzle head in relation to the substrate 1 by controlling the moving system;

move the first precursor nozzle 2 and the second precursor nozzle 4 in relation to each other and in relation to the substrate 1 by controlling the moving system; or move the first precursor nozzle 2 in relation to the substrate 1 and in relation to the second precursor nozzle 4 and keeping the second precursor nozzle 4 and the substrate 1 stationary in relation to each other by controlling the moving system.

Therefore, the control system is arranged to control the supply of the first precursor and the second precursor by controlling the precursor supply system and simultaneously move the substrate 1 relative to at least one of the first precursor nozzle 2 and second precursor nozzle 4 or the nozzle head by controlling the moving system such that only the one or more first limited sub-areas are subjected to both the first precursor and the second precursor.

The present invention provides a method which comprises subjecting one or more first limited sub-areas of the surface 3 of the substrate 1 to both the first precursor and the second precursor by co-operation of supplying the first precursor and the second precursor and simultaneously moving the substrate 3 relative to at least one of the first precursor nozzle 2 and second precursor nozzle 4 for providing one or more coating layers on the first limited sub-areas of the surface 3 of the substrate 1. This may be achieved by introducing the supply of at least one of the first precursor and the second precursor and simultaneously moving the substrate 1 relative to at least one of the first precursor nozzle 2 and second precursor nozzle 4 such that only the one or more first limited sub-areas are subjected to both the first precursor and the second precursor. The method may carried out by introducing the first precursor and the second precursor supply such that the first precursor is supplied to the surface 3 of the substrate 1 when the first precursor nozzle simultaneously scans over the one or more first limited sub-areas and the second precursor is supplied to the surface 3 of the substrate 1 when the second precursor nozzle simultaneously scans over the one or more first limited sub-areas during the relative movement of the substrate 1 and the first precursor nozzle 2 and the second precursor nozzle 4. Alternatively this may be carried out by introducing only the first precursor such that the first precursor is supplied to the surface 3 of the substrate 1 when the first precursor nozzle simultaneously scans over the one or more first limited sub-areas during the relative movement of the substrate 1 and the first precursor nozzle 2, and supplying the second precursor continuously to the surface 3 of the substrate 1 during the simultaneous relative movement of the substrate 1 and the and the second precursor nozzle 4.

Alternatively subjecting the first limited sub-areas to the first and second precursors may be achieved the method comprises moving the substrate 1 relative to at least one of the first precursor nozzle 2 and the second precursor nozzle 4 such that the movements of the first precursor nozzle 2 and the second precursor nozzle 4 over the surface 3 of the substrate 1 are overlapped only on the first limited sub-areas of the surface 3 of the substrate 1 for providing one or more coating layers on the first limited sub-areas.

In the present invention the first limited sub-areas are subjected to both the first and second precursors for providing coating layers by moving at least one of the first and second precursor nozzles relative to the substrate and simultaneously supplying the first and second precursors from the first and second precursor nozzles. The other parts of the surface of the substrate outside the one or more first limited sub-areas, meaning one or more second limited sub-areas are not subjected to both the first and second precursors, but only one of the first and second precursors or neither of the first and second precursors. Thus coating layers are not formed on the second limited sub-areas. Accordingly the method of the present invention comprises subjecting one or more first limited sub-areas of the surface of the substrate to both the first precursor and the second precursor and one or more second sub-areas of the surface of the substrate to first precursor or second precursor or neither of the first and second precursor by co-operation of supplying the first precursor and the second precursor and simultaneously moving the substrate relative to at least one of the first precursor nozzle and second precursor nozzle for providing one or more coating layers on the first limited sub-areas of the surface of the substrate. Further the control system of the present invention is arranged to control the precursor supply system and the moving system in co-operation for providing one or more coating layers on one or more first limited sub-areas of the surface of the substrate and leaving one or more second limited sub-areas without coating layers by synchronised supply of the first precursor and the second precursor from the first precursor nozzle and the second precursor nozzle, respectively, and simultaneous movement of the substrate relative to at least one of the first precursor nozzle and second precursor nozzle. Accordingly, in the present invention one or more first limited sub-areas of the surface of the substrate are subjected to both the first precursor and the second precursor and one or more second sub-areas of the surface of the substrate to only one precursor or to no precursors first precursor or second precursor or neither of the first and second precursor by co-operation of supplying the first precursor and the second precursor and simultaneously moving the substrate relative to at least one of the first precursor nozzle and second precursor nozzle for providing one or more coating layers on the first limited sub-areas of the surface of the substrate.

It will be obvious to a person skilled in the art that, as the technology advances, the inventive concept can be implemented in various ways. The invention and its embodiments are not limited to the examples described above but may vary within the scope of the claims.

The invention claimed is:

1. A method for providing one or more coating layers on a surface of a substrate by successive surface reactions of at least a first precursor and a second precursor according to the principles of atomic layer deposition, comprising:
   supplying the first precursor from at least one first precursor nozzle and the second precursor from at least one second precursor nozzle to the surface of the substrate;
   moving the substrate relative to at least one of the first precursor nozzle and the second precursor nozzle for subjecting the surface of the substrate to successive surface reactions of at least the first precursor and the second precursor;
   subjecting one or more first limited sub-areas of the surface of the substrate to both the first precursor and the second precursor and one or more second sub-areas of the surface of the substrate to only one precursor or to no precursors by co-operation of supplying the first precursor and the second precursor and simultaneously moving the substrate relative to at least one of the first precursor nozzle and the second precursor nozzle for providing one or more coating layers on the first limited sub-areas of the surface of the substrate and leaving the second limited sub-areas without coating layers; and
   moving the substrate relative to at least one of the first precursor nozzle and the second precursor nozzle such that the movements of the first precursor nozzle and the second precursor nozzle over the surface of the substrate are overlapped only on the first limited sub-areas over the surface of the substrate for providing one or more coating layers on the first limited sub-areas.

2. The method according to claim 1, comprising either:
   introducing the supply of at least one of the first precursor and the second precursor and simultaneously moving the substrate relative to at least one of the first precursor nozzle and the second precursor nozzle such that only the one or more limited sub-areas are subjected to both the first precursor and the second precursor; or
   moving the substrate relative to at least one of the first precursor nozzle and the second precursor nozzle at constant speed and simultaneously introducing the supply of at least one of the first precursor and the second precursor such that only the one or more first limited sub-areas are subjected to both the first precursor and the second precursor.

3. The method according to claim 2, wherein the introducing of the supply of at least one of the first precursor and the second precursor is carried out by:
   introducing the first precursor and the second precursor supply such that the first precursor is supplied to the surface of the substrate when the first precursor nozzle scans over the one or more first limited sub-areas and the second precursor is supplied to the surface of the substrate when the second precursor nozzle scans over the one or more first limited sub-areas during the relative movement of the substrate and the first precursor nozzle and the second precursor nozzle; and
   introducing the first precursor such that the first precursor is supplied to the surface of the substrate when the first precursor nozzle scans over the one or more first limited sub-areas during the relative movement of the substrate and the first precursor nozzle, and supplying the second precursor continuously to the surface of the substrate during the relative movement of the substrate and the second precursor nozzle.

4. The method according to claim 1, comprising either:
   moving the substrate relative to at least one of the first precursor nozzle and the second precursor nozzle in reciprocating movement between a first relative position and a second relative position and simultaneously introducing the supply of at least one of the first precursor and the second precursor such that only the one or more first limited sub-areas are subjected to both the first precursor and the second precursor; or
   moving the substrate relative to at least one of the first precursor nozzle and the second precursor nozzle along a curved coating path and simultaneously introducing the supply of at least one of the first precursor and the second precursor such that only the one or more first limited sub-areas are subjected to both the first precursor and the second precursor.

5. The method according to claim 4, wherein the introducing of the supply of at least one of the first precursor and the second precursor is carried out by:
   introducing the first precursor and the second precursor supply such that the first precursor is supplied to the surface of the substrate when the first precursor nozzle scans over the one or more first limited sub-areas and the second precursor is supplied to the surface of the substrate when the second precursor nozzle scans over the one or more first limited sub-areas during the relative movement of the substrate and the first precursor nozzle and the second precursor nozzle;

introducing the first precursor such that the first precursor is supplied to the surface of the substrate when the first precursor nozzle scans over the one or more first limited sub-areas during the relative movement of the substrate and the first precursor nozzle, and supplying the second precursor continuously to the surface of the substrate during the relative movement of the substrate and the second precursor nozzle.

6. The method according to claim 1, comprising either:

moving the substrate relative to at least one of the first precursor nozzle and the second precursor nozzle in reciprocating movement between a first relative position and a second relative position over the surface of the substrate such that the reciprocating movements of the first precursor nozzle and the second precursor nozzle are overlapped on the first limited sub-areas over the surface of the substrate; or moving the first precursor nozzle and the second precursor nozzle in reciprocating movement in relation to the substrate between a first relative position and a second relative position over the surface of the substrate such that the second relative position of the first precursor nozzle overlaps at least partly the first relative position of the second precursor nozzle during the reciprocating movement for subjecting the surface of the substrate to both the first precursor and the second precursor at the one or more first limited sub-areas provided by the overlapped regions of the first and second relative positions.

7. The method according to claim 6, wherein the first precursor nozzle has a first width (w1) and the second precursor nozzle has a second width (w2) in a direction of the reciprocating movement and the first precursor nozzle and the second precursor nozzle are arranged at a distance (w3) from each other in the direction of the reciprocating movement, and the method comprises:

moving the first precursor nozzle and the second precursor nozzle in reciprocating movement in relation to the substrate and simultaneously keeping the first precursor nozzle and second precursor nozzle stationary in relation to each other such that a travelling length (L) of the first precursor nozzle and the second precursor nozzle in the reciprocating movement is:

$w3 < L < 2*w3 + w1$; or $w3 < L < 2*w3 + w2$, for subjecting the surface of the substrate to both the first precursor and the second precursor at the one or more first limited sub-areas provided by the overlapped regions of the first precursor nozzle and the second precursor nozzle over the surface of the substrate.

8. The method according to claim 7, wherein the travelling length of the first precursor nozzle and the second precursor nozzle in the reciprocating movement is substantially:

$L = w3 + w1$; or $L = w3 + w2$.

9. The method according to claim 1, comprising:

moving the first precursor nozzle and the second precursor nozzle in relation to the substrate along a curved coating path or a loop path over the surface of the substrate such that the curved coating paths of the first precursor nozzle and the second precursor nozzle are overlapped on the first limited sub-areas over the surface of the substrate.

10. The method according to claim 1, comprising either:

moving the first precursor nozzle and the second precursor nozzle in relation to the substrate and simultaneously keeping the first precursor nozzle and the second precursor nozzle stationary in relation to each other; or moving the first precursor nozzle and the second precursor nozzle in relation to each other and in relation to the substrate; or moving the first precursor nozzle in relation to the substrate and in relation to the second precursor nozzle and simultaneously keeping the second precursor nozzle and the substrate stationary in relation to each other.

* * * * *